(12) United States Patent
Dyvorne et al.

(10) Patent No.: US 12,298,374 B2
(45) Date of Patent: *May 13, 2025

(54) SYSTEMS AND METHODS FOR LOW-FIELD FAST SPIN ECHO IMAGING

(71) Applicant: Hyperfine Operations, Inc., Guilford, CT (US)

(72) Inventors: Hadrien A. Dyvorne, New York, NY (US); Laura Sacolick, Guilford, CT (US); Rafael O'Halloran, Guilford, CT (US); Carole Lazarus, Paris (FR)

(73) Assignee: Hyperfine Operations, Inc., Guilford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/538,806

(22) Filed: Dec. 13, 2023

(65) Prior Publication Data

US 2024/0142555 A1 May 2, 2024

Related U.S. Application Data

(63) Continuation of application No. 18/098,919, filed on Jan. 19, 2023, now Pat. No. 11,852,709, which is a
(Continued)

(51) Int. Cl.
*G01R 33/561* (2006.01)
*G01R 33/36* (2006.01)
(Continued)

(52) U.S. Cl.
CPC ..... *G01R 33/5618* (2013.01); *G01R 33/3607* (2013.01); *G01R 33/445* (2013.01);
(Continued)

(58) Field of Classification Search
None
See application file for complete search history.

(56) References Cited

U.S. PATENT DOCUMENTS 11,561,272 B2   1/2023  Dyvorne et al.
11,852,709 B2 * 12/2023  Dyvorne ............ G01R 33/3607
(Continued)

OTHER PUBLICATIONS

Gibbons et al., Body diffusion weighted imaging using non-CPMG fast spin echo. IEEE transactions on medical imaging. Oct. 2016; 36(2):12 pages.
(Continued)

*Primary Examiner* — Rodney E Fuller
(74) *Attorney, Agent, or Firm* — Foley & Lardner LLP

(57) ABSTRACT

A magnetic resonance imaging (MRI) system and method for acquiring magnetic resonance (MR) images using a pulse sequence implementing driven equilibrium and quadratic phase cycling techniques is provided. The method includes, during a pulse repetition period of a pulse sequence and using a quadratic phase cycling scheme, applying a first RF pulse to deflect a net magnetization vector associated with the subject from a longitudinal plane into a transverse plane; after applying the first RF pulse, applying a first sequence of RF pulses each of which flips the net magnetization vector by approximately 180 degrees within the transverse plane; and after applying the first sequence of RF pulses, applying a second RF pulse to deflect the net magnetization vector from the transverse plane to the longitudinal plane.

20 Claims, 9 Drawing Sheets

Related U.S. Application Data continuation of application No. 17/334,001, filed on May 28, 2021, now Pat. No. 11,561,272.

(60) Provisional application No. 63/031,991, filed on May 29, 2020.

(51) Int. Cl.
*G01R 33/44* (2006.01)
*G01R 33/48* (2006.01)
*G01R 33/54* (2006.01)
*G01R 33/56* (2006.01)

(52) U.S. Cl.
CPC ....... *G01R 33/4824* (2013.01); *G01R 33/543* (2013.01); *G01R 33/5602* (2013.01); *G01R 33/5613* (2013.01)

(56) References Cited

U.S. PATENT DOCUMENTS

| | | |
|---|---|---|
| 2002/0167317 A1 | 11/2002 | Shenoy et al. |
| 2013/0314086 A1 | 11/2013 | Li et al. |
| 2017/0212200 A1 | 7/2017 | Li et al. |
| 2018/0136300 A1 | 5/2018 | De Rochefort |
| 2018/0143280 A1 | 5/2018 | Dyvorne et al. |
| 2021/0048498 A1 | 2/2021 | Dyvorne et al. |
| 2021/0373107 A1 | 12/2021 | Dyvorne et al. |

OTHER PUBLICATIONS

International Preliminary Report on Patentability for International Application No. PCT/US2021/034869 mailed Dec. 8, 2022.
International Search Report and Written Opinion for International Application No. PCT/US2021/034869 mailed Sep. 9, 2021.

* cited by examiner

SYSTEMS AND METHODS FOR LOW-FIELD FAST SPIN ECHO IMAGING

RELATED APPLICATIONS

This Application is a continuation of U.S. application Ser. No. 18/098,919 filed Jan. 19, 2023 (now U.S. Pat. No. 11,852,709), which is a continuation of U.S. application Ser. No. 17/334,001 filed May 28, 2021 (now U.S. Pat. No. 11,561,272), which claims priority under 35 U.S.C. § 119(e) to U.S. Provisional Patent Application No. 63/031,991 filed May 29, 2020, each of which is herein incorporated by reference in its entirety.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

SUMMARY

Some embodiments are directed to a magnetic resonance imaging (MRI) system, the MRI system comprising: a magnetics system comprising a plurality of magnetics components configured to produce magnetic fields for performing MRI, the plurality of magnetics components including at least one radio frequency (RF) coil for transmitting and/or receiving RF pulses; and at least one controller configured to operate one or more of the plurality of magnetics components in accordance with a pulse sequence having a plurality of pulse repetition periods over which magnetic resonance (MR) signals are produced and detected. During one pulse repetition period of the plurality of pulse repetition periods, the at least one controller is configured to operate the at least one RF coil using a quadratic phase cycling scheme and to: control the at least one RF coil to apply a first RF pulse to deflect a net magnetization vector associated with the subject from the longitudinal plane into a transverse plane; after applying the first RF pulse, control the at least one RF coil to apply a first sequence of RF pulses each of which flips the net magnetization vector by approximately 180 degrees within the transverse plane; and after applying the first sequence of RF pulses, control the at least one RF coil to apply a second RF pulse to deflect the net magnetization vector from the transverse plane to the longitudinal plane.

Some embodiments are directed to a method of acquiring an MR image of a subject using an MRI system. The method comprises, during one pulse repetition period of a plurality of pulse repetition periods of a pulse sequence, the plurality of pulse repetition periods being periods over which MR signals are produced and detected: controlling, using at least one controller configured to operate one or more of a plurality of magnetics components of the MRI system in accordance with the pulse sequence and using a quadratic phase cycling scheme, at least one RF coil of the MRI system to apply a first RF pulse to deflect a net magnetization vector associated with the subject from a longitudinal plane into a transverse plane; after applying the first RF pulse, controlling, using the at least one controller, the at least one RF coil to apply a first sequence of RF pulses each of which flips the net magnetization vector by approximately 180 degrees within the transverse plane; and after applying the first sequence of RF pulses, controlling, using the at least one controller, the at least one RF coil to apply a second RF pulse to deflect the net magnetization vector from the transverse plane to the longitudinal plane.

Some embodiments are directed to at least one non-transitory computer-readable storage medium storing processor-executable instructions that, when executed by an MRI system, cause the MRI system to perform a method. The method comprises, during one pulse repetition period of a plurality of pulse repetition periods of a pulse sequence, the plurality of pulse repetition periods being periods over which MR signals are produced and detected: controlling, using at least one controller configured to operate one or more of a plurality of magnetics components of the MRI system in accordance with the pulse sequence and using a quadratic phase cycling scheme, at least one RF coil of the MRI system to apply a first RF pulse to deflect a net magnetization vector associated with the subject from a longitudinal plane into a transverse plane; after applying the first RF pulse, controlling, using the at least one controller, the at least one RF coil to apply a first sequence of RF pulses each of which flips the net magnetization vector by approximately 180 degrees within the transverse plane; and after applying the first sequence of RF pulses, controlling, using the at least one controller, the at least one RF coil to apply a second RF pulse to deflect the net magnetization vector from the transverse plane to the longitudinal plane.

Some embodiments are directed to a magnetic resonance imaging (MRI) system, comprising: a magnetics system comprising a plurality of magnetics components configured to produce magnetic fields for performing MRI, the plurality of magnetics components including at least one radio frequency (RF) coil for transmitting and/or receiving RF pulses; and at least one controller configured to operate one or more of the plurality of magnetics components in accordance with a pulse sequence having a plurality of pulse repetition periods over which magnetic resonance (MR) signals are produced and detected, wherein, during one pulse repetition period, of the plurality of pulse repetition periods, the at least one controller is configured to operate the at least one RF coil using an eddy current correction scheme and to control the at least one RF coil to apply a first RF pulse to deflect a net magnetization vector associated with a subject from a longitudinal plane into a transverse plane; after applying the first RF pulse, control the at least one RF coil to apply a first sequence of RF pulses each of which flips the net magnetization vector by approximately 180 degrees within the transverse plane; and after applying the first sequence of RF pulses, control the at least one RF coil to apply a second RF pulse to deflect the net magnetization vector from the transverse plane to the longitudinal plane.

In some embodiments, the pulse sequence comprises a fast spin echo (FSE) pulse sequence.

In some embodiments, the pulse sequence comprises a T2-weighted pulse sequence.

In some embodiments, the pulse sequence comprises a fluid-attenuated inversion recovery (FLAIR) pulse sequence.

In some embodiments, the magnetics system further comprises: a $B_0$ magnetic component configured to produce a $B_0$ magnetic field for the MRI system; and at least one gradient coil configured to, when operated, provide spatial encoding of emitted MR signals.

In some embodiments, the $B_0$ magnetic component comprises at least one permanent magnet.

In some embodiments, the $B_0$ magnetic component is configured to produce a $B_0$ field having a strength greater than or equal to 0.02 T and less than or equal to 0.2 T. In some embodiments, the $B_0$ magnetic component is configured to produce a $B_0$ field having a strength greater than or equal to 0.05 T and less than or equal to 0.1 T.

In some embodiments, the MRI system further comprises a direct digital synthesizer (DDS) coupled to the at least one RF coil, and wherein using the quadratic phase cycling scheme comprises modifying a phase of a waveform generated by the DDS.

In some embodiments, the MRI system further comprises an analog-to-digital converter (ADC) coupled to the at least one RF coil. The controller is further configured to periodically enable the ADC in conjunction with the first sequence of RF pulses, and a center of each period of ADC enablement corresponds to a center of each period of time between RF pulses of the first sequence of RF pulses.

In some embodiments, the pulse sequence is configured to sample k-space using a non-Cartesian sampling pattern.

BRIEF DESCRIPTION OF THE DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
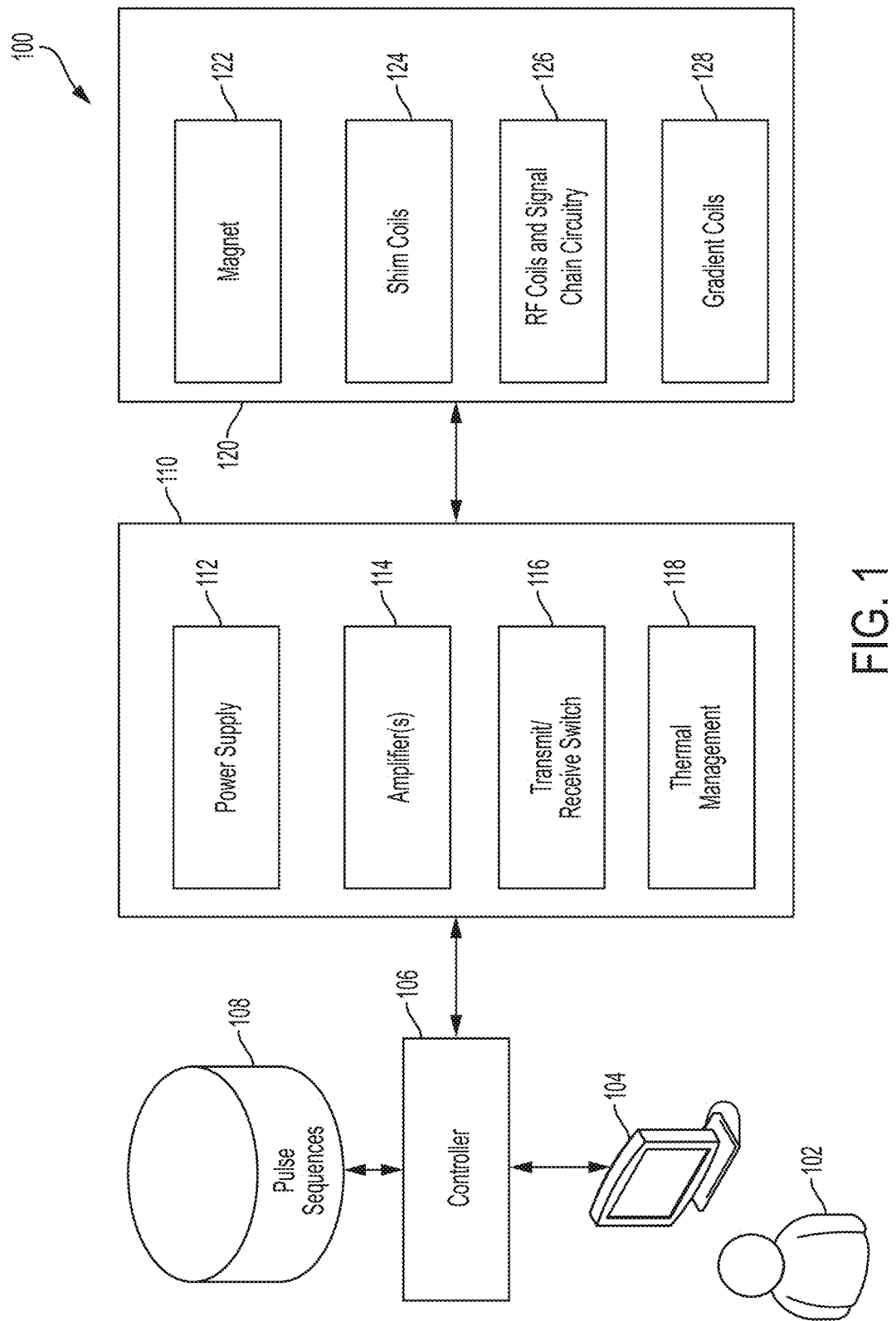
FIG. 1 illustrates exemplary components of a magnetic resonance imaging (MRI) system, in accordance with some embodiments of the technology described herein.

Biological tissues and fluids exhibit differing responses to magnetic fields based on parameters such as material density and chemical composition. Such differences between biological tissue types can present challenges for the acquisition of magnetic resonance (MR) images, resulting in longer MR image acquisition times or artefacts in the acquired MR images. Briefly, magnetic resonance imaging (MRI) involves placing a subject to be imaged (e.g., all or a portion of a patient) in a static, homogenous magnetic field, $B_0$, to align a subject's atomic net magnetization (often represented by a net magnetization vector) in the direction of the $B_0$ field. One or more transmit coils are then used to generate a pulsed magnetic field, $B_1$, having a frequency related to the rate of precession of atomic spins of the atoms in the magnetic field $B_0$ to cause the net magnetization of the atoms to develop a component in a direction transverse to the direction of the $B_0$ field. After the $B_1$ field is turned off, the transverse component of the net magnetization vector precesses, its magnitude decaying over time until the net magnetization re-aligns with the direction of the $B_0$ field. This process produces MR signals that can be detected by voltages induced in one or more receive coils of the MRI system.

This decay process is characterized by the T1 relaxation and T2 relaxation times of the magnetization vector. The T1 relaxation time characterizes the time it takes for the magnetization vector to realign with the $B_0$ field, and the T2 relaxation time characterizes the time it takes components of the magnetization vector that are transverse to the direction of the $B_0$ field to dephase. These relaxation processes proceed through energy transfer from the atomic spins to their environment. Accordingly, the physical properties (e.g., density, phase of matter, etc.) of the tissue being imaged affect the T1 and T2 relaxation times of spins within the imaging region. Liquids, such as cerebrospinal fluid (CSF) often have longer T1 and T2 relaxation times than denser tissues (e.g., muscle, gray matter, bone). For example, CSF has a T1 relaxation time of approximately four seconds, while muscle has a T1 relaxation time of approximately 0.9 seconds. These extended relaxation times translate to longer magnetization recovery times during MR image acquisition in order to allow for spins within the imaging region to realign to the $B_0$ field. Subsequently, these extended relaxation times cause longer MR image acquisition procedures, which may be uncomfortable for the patient, who may be asked to stay as still as possible during imaging, and/or detrimental to emergency imaging procedures, which preferably produce images quickly.

The inventors have recognized and appreciated that driven equilibrium techniques can be used to recover the longitudinal magnetization (e.g., alignment with the $B_0$ field) at the end of an MR imaging sequence to reduce the T1 relaxation time of biological fluids. For example, a driven equilibrium technique may be implemented by including a 90° "tip up" or "flip-back" radio frequency pulse at the end of an MR imaging pulse sequence. Such a 90° tip up pulse is used to restore longitudinal magnetization at the end of the MR imaging sequence by tipping the magnetic orientation of spins within the imaging region back into the longitudinal plane. This tipping reduces the T1 relaxation time of the spins within the region, resulting in a reduced repetition time (TR) of the pulse sequence and shortened MR imaging sequences.

Additionally, the inventors have further recognized and appreciated that unique challenges are presented by implementing driven equilibrium techniques in a low-field, portable MRI system. For example, the inventors have recognized and appreciated that eddy currents caused by gradient magnetic fields during imaging may be more disruptive to acquiring clinically-useful MR images in a low-field MRI system than a high-field MRI system. Low-field MRI systems operate at a lower signal-to-noise ratio (SNR) as compared to a high-field MRI system, and thus eddy current effects can be amplified in a low-field MRI system. For example, eddy current effects may cause dephasing (e.g., drifting or misalignment) of spins in the transverse plane. A tip up pulse will successfully return all the spins to the longitudinal direction if they are aligned (e.g., in phase) in the transverse plane. Thus, dephasing of the spins due to eddy current effects can cause the tip up pulse to be ineffective at returning the spins to the longitudinal direction. The inventors have thus further recognized and appreciated that implementing driven equilibrium techniques in concert with quadratic phase cycling of the RF pulses can mitigate the effects of eddy currents during MR imaging in a low-field MRI system. Such eddy current mitigation can enable driven equilibrium imaging sequences in the presence of eddy currents.

The inventors have further recognized that various other techniques for mitigating effects of eddy currents can be used in conjunction with or instead of quadratic phase cycling techniques to improve driven equilibrium imaging in a low-field MRI system. For example, in some embodiments, preparation gradient field pulses may be generated prior to a first RF pulse of the repetition period in order to balance a gradient moment of the first and second gradient pulses of the MR imaging sequence of the repetition period. Alternatively or additionally, in some embodiments, an eddy current correction filter may be applied to the gradient field pulses to pre-emphasize the gradient waveform and mitigate eddy currents caused by the application of the gradient fields during MR imaging. In some embodiments, the eddy current correction filter may be based on a linear response of the MRI system to applied gradient field pulses. Alternatively, the eddy current correction filter may be based on a non-linear response of the MRI system to the applied gradient field pulses.

Accordingly, the inventors have developed systems and methods for acquiring MR images using a low-field MRI system to implement pulse sequences using driven equilibrium and quadratic phase cycling techniques. Such techniques can significantly reduce the length of an MR imaging procedure and may be particularly valuable when performing three-dimensional (3D) MR imaging, in which an entire volume is imaged at once, in comparison to two-dimensional (2D) MR imaging, in which the volume is imaged as a series of 2D slices.

For example, using the techniques described herein, the T1 relaxation time of CSF may be reduced from approximately 4 seconds to approximately 1.5 seconds. Because MR imaging procedures often repeat image acquisition multiple times to increase SNR, such a reduction of T1 relaxation time can significantly reduce the total length of the MR imaging procedure. For example, an MR imaging procedure of a subject's brain can be, using the techniques described herein, reduced in length from approximately 6 minutes to approximately 3 minutes in length. Such shortened MR imaging procedures may be particularly desirable in facilities such as emergency rooms and/or trauma wards.

In some embodiments, a method of acquiring an MR image of a subject using an MRI system is provided. The MRI system includes a magnetics system including magnetics components configured to produce magnetic fields for performing MRI. The magnetics components include, for example, at least one radio frequency (RF) coil for transmitting and/or receiving RF signals ("pulses"). The MRI system also includes a controller configured to operate one or more of the magnetics components in accordance with a pulse sequence having a plurality of pulse repetition periods over which MR signals are produced and detected (e.g., by the at least one RF coil).

In some embodiments, the magnetics system of the MRI system further includes a $B_0$ magnetic component configured to produce a $B_0$ magnetic field for the MRI system and at least one gradient coil configured to provide spatial encoding of emitted MR signals. The $B_0$ magnetic component may include, for example, at least one permanent magnet (e.g., composed of a permanent magnetic material including but not limited to Fe, Co, CoFe, $SmCo_5$, and/or $Nd_2Fe_{14}B$) and may be configured to produce a B0 magnetic field having a field strength greater than or equal to 0.02 T and less than or equal to 0.2 T, greater than or equal to 0.05 T and less than or equal to 0.1 T, or any additional range of field strengths within those ranges.

In some embodiments, the controller may first, for a pulse repetition period, control the at least on RF coil of the MRI system to apply a first RF pulse to deflect a net magnetization vector associated with the subject (e.g., a patient being imaged) from a longitudinal plane into a transverse plane. Conventionally, the Z-axis in MRI is defined to be aligned with the direction of the main magnetic field $B_0$. The longitudinal and transverse planes may then be defined with respect to the Z-axis, with the Z-axis being parallel to the longitudinal plane and the Z-axis being perpendicular to the transverse plane.

In some embodiments, the controller may then, after applying the first RF pulse, control the at least one RF coil to apply a first sequence of RF pulses. Each of the RF pulses of the first sequence of RF pulses may cause the net magnetization vector associated with the subject to flip by approximately 180 degrees within the transverse plane. Such 180 degree RF pulses may realign the magnetic spins associated with the subject, allowing for the collection of emitted MR signals from the subject.

In some embodiments, the controller may be configured to periodically enable an analog-to-digital converter (ADC) coupled to the RF coil in order to enable receiving of MR signals from the subject. The controller may be configured to enable the ADC in conjunction with pulses of the first sequence of RF pulses. For example, a center of each period of ADC enablement may correspond to a center of each RF pulse of the first sequence of RF pulses.

In some embodiments, after applying the first sequence of RF pulses, the controller may then apply a second RF pulse (e.g., a driven equilibrium pulse) to deflect the net magnetization vector associated with the subject from the transverse plane to the longitudinal plane (e.g., aligned with the $B_0$ magnetic field). The second RF pulse may reduce the T1 relaxation time of spins associated with the subject by recovering their alignment with the $B_0$ magnetic field at the end of the pulse repetition period. By reducing the T1 relaxation time of these spins (e.g., by reducing the time for spins to realign with the $B_0$ magnetic field), a wait time between pulse repetition periods may be reduced, decreasing the total repetition time (TR) of the pulse repetition period and the total length of the pulse sequence.

In some embodiments, the controller operates the at least one RF coil by using a quadratic phase cycling scheme, which involves: (1) setting phases of one or more RF pulses within a pulse repetition period in accordance with the quadratic phase cycling scheme; and (2) controlling the at least one RF coil to apply the RF pulses having their phase set in this manner. Setting the phases of the first RF pulse, the first sequence of RF pulses, and/or the second RF pulse may include modulating the phases throughout a pulse repetition period of a pulse sequence. By modulating the phases of the RF pulses transmitted by the RF coil, a stable MR signal may be provided regardless of the initial phase of the net magnetization vector associated with the subject at the start of each echo period. Additionally, modulating the phases of the RF pulses transmitted and received by the MRI system may mitigate effects of induced eddy currents in the structure of the MRI system.

In some embodiments, setting the phases of the first RF pulse, the first sequence of RF pulses, and/or the second RF pulse may be performed according to any suitable quadratic phase cycling scheme. As used herein, a phase cycling scheme describes a technique in which the phases of transmitted and received RF pulses are modulated throughout a pulse repetition period of the pulse sequence. A quadratic phase cycling scheme is one in which the phases of the RF pulses are varied such that they are proportional to a square of a position of the RF pulse within the pulse repetition period. In some embodiments, the phases of some (e.g., one or more) of the RF pulses of the first RF pulse, the first sequence of RF pulses, and/or the second RF pulse may be modulated according to the quadratic phase cycling scheme. In some embodiments, the phases of all RF pulses of the first RF pulse, the first sequence of RF pulses, and/or the second RF pulse may be modulated according to the quadratic phase cycling scheme.

In some embodiments, setting the phases of the first RF pulse, the first sequence of RF pulses, and/or the second RF pulse using the quadratic phase cycling scheme may include modulating the phases of the transmitted and received RF pulses of a pulse repetition period of a pulse sequence. In some embodiments, setting the phases of the transmitted and received RF pulses may be performed using a particular quadratic phase cycling scheme where, for an $i^{th}$ spin echo cycle of the pulse repetition period, the phases of the transmitted RF pulses are proportional to $i^2$ and the phases of the received RF pulses are proportional to $i(i+1)$. The constant of proportionality for both transmit and receive RF pulse phases may be the same quadratic step constant, $\Delta$. The controller may set the phases of the first RF pulse, the first sequence of RF pulses, and the second RF pulse by modifying a phase of a waveform generated by a direct digital synthesizer (DDS) coupled to the at least one RF coil.

In some embodiments, the pulse sequence may be, for example, one of a fast spin echo (FSE) pulse sequence, a T2-weighted pulse sequence, and/or a fluid-attenuated inversion recovery (FLAIR) pulse sequence. In some embodiments, the pulse sequence may be configured to sample k-space using a non-Cartesian sampling pattern.

As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime. Within the low-field regime, low-field MRI systems operating with a $B_0$ field of less than 0.1 T are referred to herein as "very low-field" and low-field MRI systems operating with a $B_0$ field of less than 10 mT are referred to herein as "ultra-low field."

Following below are more detailed descriptions of various concepts related to, and embodiments of, techniques for implementing pulse sequences including a driven equilibrium radio frequency pulse. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1 is a block diagram of typical components of a MRI system 100. In the illustrative example of FIG. 1, MRI system 100 comprises computing device 104, controller 106, pulse sequences store 108, power management system 110, and magnetics components 120. It should be appreciated that system 100 is illustrative and that a MRI system may have one or more other components of any suitable type in addition to or instead of the components illustrated in FIG. 1. However, an MRI system will generally include these high level components, though the implementation of these components for a particular MRI system may differ. It may be appreciated that the techniques described herein for detecting patient motion may be used with any suitable type of MRI systems including high-field MRI systems, low-field MRI systems, and ultra-low field MRI systems. For example, the techniques described herein may be used with any of the MRI systems described herein and/or as described in U.S. Patent Application Publication No. 2018/143,280 filed Jun. 30, 2017, and titled "Low-Field Magnetic Resonance Imaging Methods and Apparatus," which is incorporated by reference herein in its entirety.

As illustrated in FIG. 1, magnetics components 120 comprise $B_0$ magnet 122, shim coils 124, RF coils and signal chain circuitry 126, and gradient coils 128. Magnet 122 may be used to generate the main magnetic field $B_0$. Magnet 122 may be any suitable type or combination of magnetics components that can generate a desired main magnetic $B_0$ field. In some embodiments, magnet 122 may be a permanent magnet, an electromagnet, a superconducting magnet, or a hybrid magnet comprising one or more permanent magnets and one or more electromagnets and/or one or more superconducting magnets.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by magnet 122 and/or shim coils 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils.

MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF coils and signal chain circuitry 126 comprise one or more transmit coils that may be used to generate RF pulses to induce an oscillating magnetic field $B_1$. The transmit coil(s) may be configured to generate any suitable types of RF pulses. Additionally, RF coils and signal chain circuitry 126 include one or more pieces of circuitry coupled to the RF coils. For example, RF coils and signal chain circuitry 126 may include a direct digital synthesizer (DDS) coupled to the at least one RF coil to generate suitable RF waveforms transmitted to the RF coils, which in turn generate RF pulses during MRI. Additionally, RF coils and signal chain circuitry 126 may include an analog-to-digital converter (ADC) coupled to the RF coils. The ADC may be configured to convert analog MR signals received by the RF coils into digital signals for later processing (e.g., for MR image reconstruction).

Power management system 110 includes electronics to provide operating power to one or more components of the low-field MRI system 100. For example, power management system 110 may include one or more power supplies, gradient power components, transmit coil components, and/or any other suitable power electronics needed to provide suitable operating power to energize and operate components of MRI system 100. As illustrated in FIG. 1, power management system 110 comprises power supply 112, power component(s) 114, transmit/receive switch 116, and thermal management components 118 (e.g., cryogenic cooling equipment for superconducting magnets). Power supply 112 includes electronics to provide operating power to magnetics components 120 of the MRI system 100. For example, power supply 112 may include electronics to provide operating power to one or more $B_0$ coils (e.g., $B_0$ magnet 122) to produce the main magnetic field for the low-field MRI system. Transmit/receive switch 116 may be used to select whether RF transmit coils or RF receive coils are being operated.

Power component(s) 114 may include one or more RF receive (Rx) pre-amplifiers that amplify MR signals detected by one or more RF receive coils (e.g., RF coils 126), one or more RF transmit (Tx) power components configured to provide power to one or more RF transmit coils (e.g., RF coils 126), one or more gradient power components configured to provide power to one or more gradient coils (e.g., gradient coils 128), and one or more shim power components configured to provide power to one or more shim coils (e.g., shim coils 124).

As illustrated in FIG. 1, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetics components 120 in a desired sequence (e.g., parameters for operating the RF transmit and receive coils 126, parameters for operating gradient coils 128, etc.). As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information.

Figure 2A:
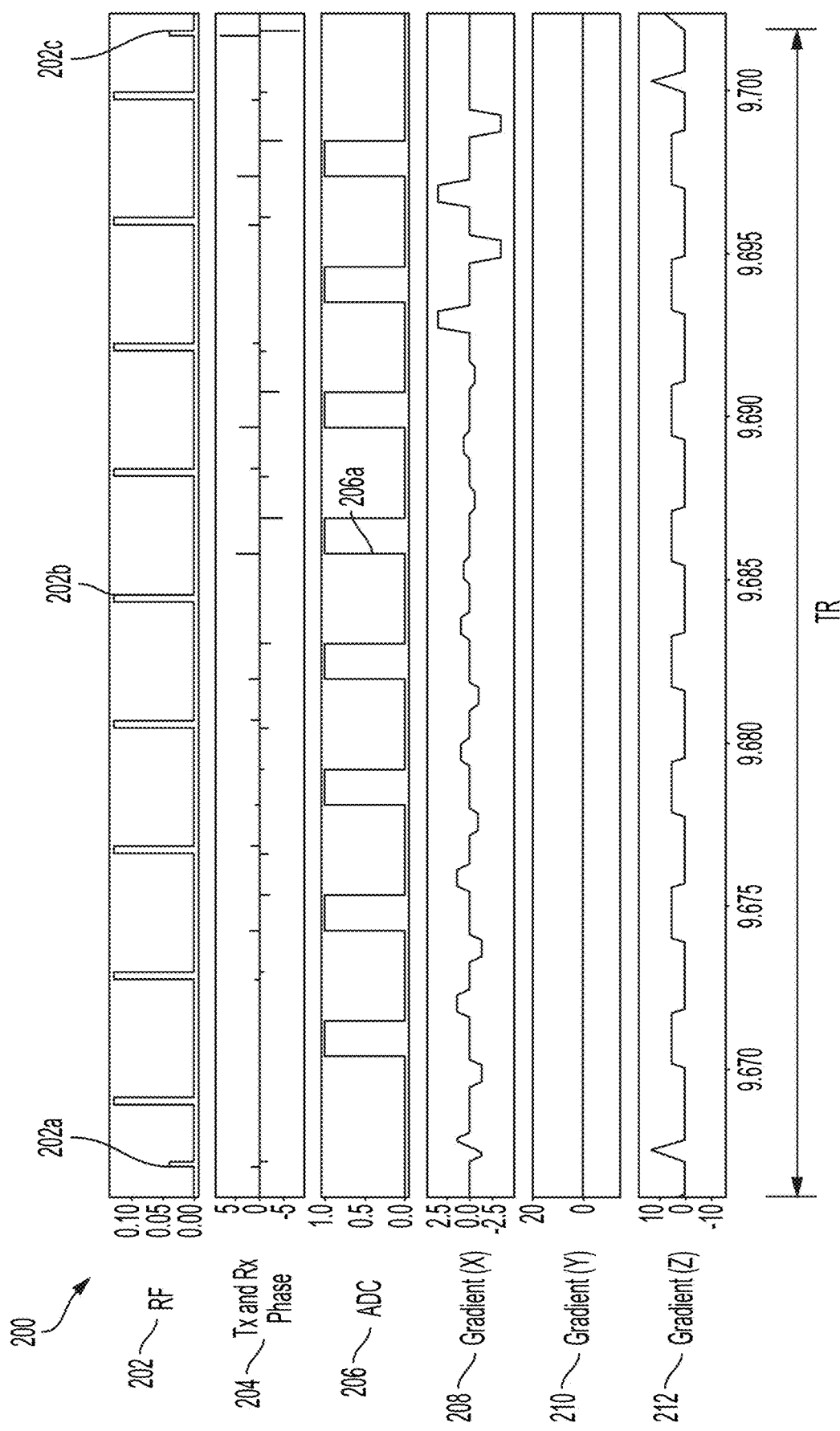
FIG. 2A is a diagram illustrating one pulse repetition period of a low-field fast spin echo pulse sequence implemented using driven equilibrium and quadratic phase cycling techniques, in accordance with some embodiments of the technology described herein.

FIG. 2A is a diagram illustrating one pulse repetition period 200 of a low-field T2-weighted pulse sequence implemented using driven equilibrium and quadratic phase cycling techniques, in accordance with some embodiments of the technology described herein. It may be appreciated that the driven equilibrium and quadratic phase cycling techniques may be applied to other pulse sequence configurations, including but not limited to spin echo pulse sequences and/or FLAIR pulse sequences. The RF pulses transmitted by the Tx RF coil(s) of the MRI system are shown by RF signal line 202 and the phases of the transmitted and received RF pulses may be modulated according to a quadratic phase cycling scheme as shown by the Tx and Rx phase signal line 204. Initially, a first RF pulse 202a may be applied. The first RF pulse 202a may be a 90° RF pulse configured to tip a net magnetization vector associated with the subject being imaged from the longitudinal plane (e.g., aligned with the $B_0$ magnetic field) into a transverse plane (e.g., perpendicular to the $B_0$ magnetic field).

In some embodiments, after transmitting the first RF pulse 202a, a series of one or more RF pulses 202b may be transmitted by the RF coil. The RF pulses 202b may be 180° RF pulses configured to flip the net magnetization vector within the transverse plane to bring the spins within the imaging region back into phase with each other. An initial RF pulse of the RF pulses 202b may be transmitted after the first RF pulse 202a after a period of time that is half as long as the periods of time between the each of the one or more RF pulses 202b.

In some embodiments, between each pulse of the RF pulses 202b, an ADC coupled to the RF coil may be enabled as shown in ADC signal line 206 in order to digitize analog MR signals detected by the RF receive coil(s) from the (e.g., portion of) subject within the imaging region of the MRI system. The ADC may be enabled by ADC enablement signals 206a. The center of ADC enablement signals 206a may correspond to a center of the periods of time between each of the RF pulses 202b as well as a center of gradient readout pulses shown in the Gradient (Z) signal line 212. The Gradient (X) signal line 208 and the Gradient (Y) signal line 210 may be configured to provide suitable spatial encoding of the received MR signals during the pulse repetition period. In some embodiments, the Gradient (X) signal line 208 and the Gradient (Y) signal line 210 may be configured to provide spatial encoding according to a non-Cartesian sampling pattern (e.g., radial, spiral, rosette, variable density, Lissajou, and/or the example non-Cartesian sampling pattern shown in FIG. 5). In some embodiments, the Gradient (X) signal line 208 and the Gradient (Y) signal line 210 may be configured to provide spatial encoding according to a Cartesian sampling pattern.

In some embodiments, after transmitting the RF pulses 202b, the RF coil may transmit second RF pulse 202c, which may be called a "driven equilibrium" pulse. The second RF pulse 202c may be a 90° RF pulse configured to tip the net magnetization vector associated with the subject from the transverse plane to the longitudinal plane. As described herein, applying the second RF pulse 202c at the end of the pulse repetition period 200 may reduce the T1 relaxation time of spins within the imaging region and may more quickly recover their longitudinal magnetization prior to a subsequent pulse repetition period.

In some embodiments, the phases of the transmitted and received RF pulses may be modulated according to a quadratic phase cycling scheme to mitigate effects of induced eddy currents in the structure of the MRI system (e.g., in a frame of the MRI system, in the $B_0$ magnetic components). The induced eddy currents may cause a spatially-varying phase modulation of the transverse magnetization associated with the subject being imaged. Such spatially-varying phase modulation may result in undesirable artifacts in the acquired MR images such as banding, distortion, or signal dropouts. To reduce the effects of spatially-varying phase modulation of the transverse magnetization, the phases of the transmitted and received RF pulses may be modulated, resulting in the net magnetization vector modulating between two stationary eigenstates during MR signal acquisition. The quadratic phase cycling condition for the transmit phase, $\Phi_{tx}$, and the receive phase, $\Phi_{rx}$, at the $i^{th}$ spin echo cycle may be written as:

$$\Phi_{tx}(i) = i^2 \Delta$$

$$\Phi_{rx}(i) = i(i+1)\Delta$$

where the constant $\Delta$ is the quadratic step.

After N RF pulses, (e.g., after the series of RF pulses 202b), the phase of the second RF pulse 202c, $\Phi_{RF2}$, may be modulated to be offset from a phase of the next ADC pulse by a value of $$\frac{\pi}{2};$$

$$\Phi_{RF2} = \Phi_{rx}(N) - \frac{\pi}{2}$$

or, equivalently:

$$\Phi_{RF2} = N(N+1)\Delta - \frac{\pi}{2}$$

Modulating the phase of the second RF pulse 202c in this manner enables the second RF pulse 202c to tip the net magnetization vector associated with the subject back into the longitudinal plane at the end of each pulse repetition period. Accordingly, in some embodiments, the phase of the RF pulse 202c may be set based on a phase of the next ADC enablement pulse (e.g., by $$\frac{\pi}{2}).$$

Other aspects of quadratic phase cycling are described in "Body Diffusion Weighted Imaging Using Non-CPMG Fast Spin Echo," by E. K. Gibbons, et. al., in *IEEE Transactions on Medical Imaging*, vol. 36, no. 2, pp. 549-559, and published in February 2017, which is incorporated by reference herein in its entirety.

Figure 2B:
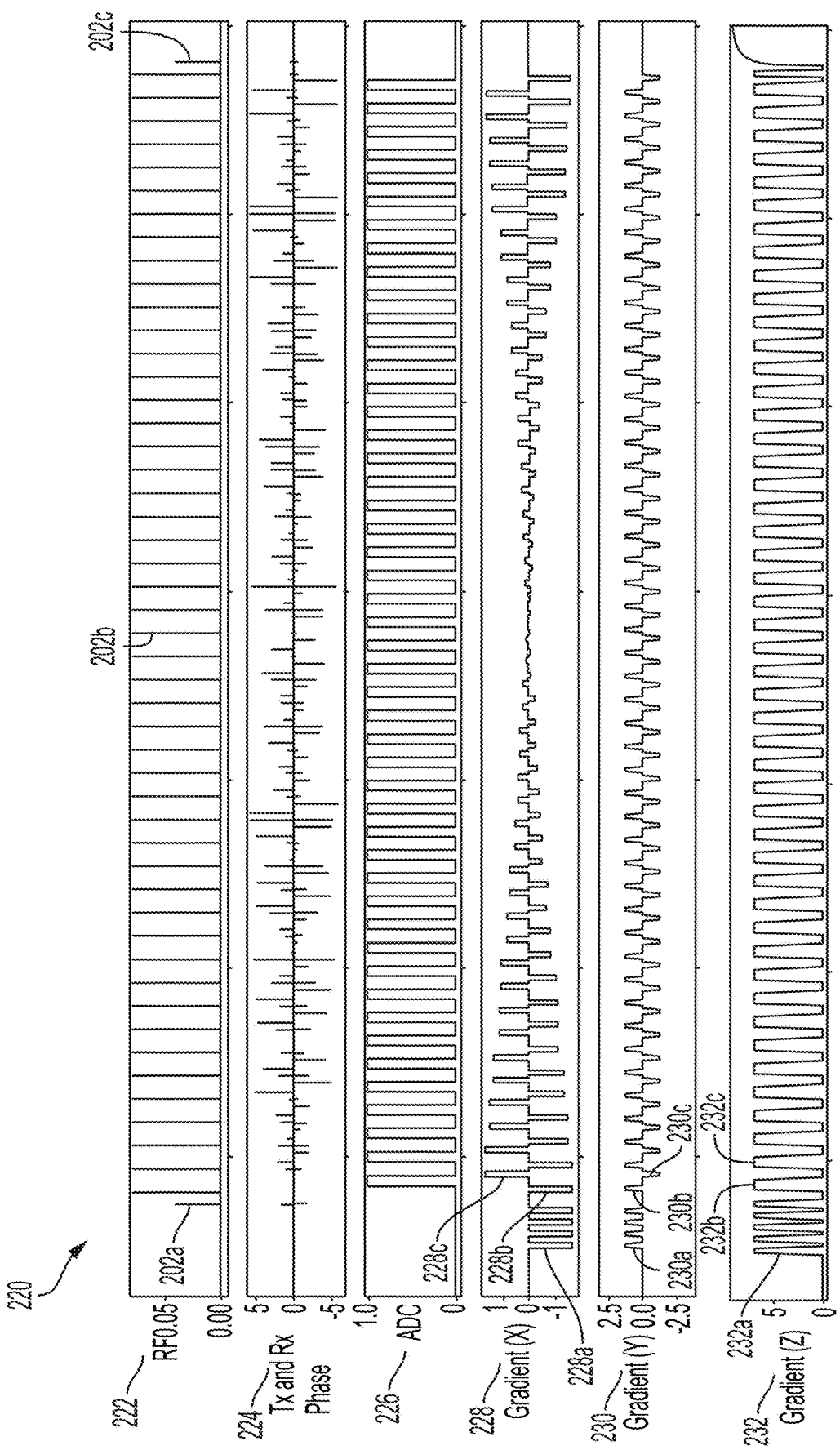
FIG. 2B is a diagram illustrating one pulse repetition period of a low-field fast spin echo pulse sequence implemented using preparation gradient field pulses, driven equilibrium, and quadratic phase cycling techniques, in accordance with some embodiments of the technology described herein.

FIG. 2B is a diagram illustrating one pulse repetition period 220 of a low-field fast spin echo pulse sequence implemented using preparation gradient field pulses, driven equilibrium, and quadratic phase cycling techniques, in accordance with some embodiments of the technology described herein. The RF pulses transmitted by the Tx RF coil(s) of the MRI system are shown by RF signal line 222 and the phases of the transmitted and received RF pulses may be modulated according to a quadratic phase cycling scheme as shown by the Tx and Rx phase signal line 224. As described in connection with the pulse repetition period 200 of FIG. 2A, initially, a first RF pulse 202a that is a 90° RF pulse may be applied. The first RF pulse 202a may be configured to tip the spins within the imaging region from the longitudinal plane (e.g., aligned with the $B_0$ magnetic field) into the transverse plane.

In some embodiments, the first RF pulse 202a may be followed by a series of one or more RF pulses 202b that are 180° RF pulses configured to bring the spins within the imaging region back into phase within the transverse plane, and thereafter may be followed by a second RF pulse 202c that is a 90° RF pulse configured to tip the net magnetization vector associated with the subject from the transverse plane to the longitudinal plane. In some embodiments, between each pulse of the RF pulses 222b, an ADC coupled to the RF coil may be enabled as shown in ADC signal line 226, and as described in connection with ADC signal line 206 of FIG. 2A, in order to digitize analog MR signals detected by the RF receive coil(s) from the (e.g., portion of) subject within the imaging region of the MRI system.

In some embodiments, the phases of the transmitted and received RF pulses may be modulated according to a quadratic phase cycling scheme to mitigate effects of induced eddy currents in the structure of the MRI system (e.g., in a frame of the MRI system, in the $B_0$ magnetic components). The quadratic phase cycling scheme pictured in the example of FIG. 2B is the same quadratic phase cycling scheme as described in connection with pulse repetition period 200 of FIG. 2A.

In some embodiments, the Gradient (X) signal line 228, the Gradient (Y) signal line 230, and the Gradient (Z) signal line 232 may be configured to provide eddy current correction by including preparation gradient field pulses 228a, 230a, and 232a. The preparation gradient field pulses 228a, 230a, and 232a are the same magnitude and direction as the first gradient field pulses 228b, 230b, and 232b generated to perform spatial encoding during MR imaging. Generating the preparation gradient field pulses 228a, 230a, and 232a at the start of the pulse repetition period 220 causes the gradient moments of the first gradient field pulses 228b, 230b, and 232b and the second gradient field pulses 228c, 230c, and 232c to be approximately equal. Reducing differences between the gradient moments of the first gradient field pulses 228b, 230b, and 232b and the second gradient field pulses 228c, 230c, and 232c can mitigate any effects of unwanted phase shifts introduced by unbalanced gradient moments at the start of the MR imaging sequence.

While pulse repetition period 220 includes eddy current corrections in the form of preparation gradient pulses 228a, 230a, and 232a, it should be appreciated that driven equilibrium and quadratic phase cycling techniques may be combined with additional or alternative eddy current correction techniques. For example, in some embodiments, the MRI system may be assumed to have a linear response to gradient field pulses. In such embodiments, a single correction filter may be used to pre-emphasize the entire gradient waveform (e.g., by performing a multi-exponential convolution).

Alternatively, in some embodiments, the MRI system may be assumed to have a non-linear response to gradient field pulses. In such embodiments, the relationship between gradient fields and resultant eddy currents may be modeled as a time-varying system, and eddy current correction may be implemented to counteract the effect of this time-varying systems on gradient fields generated from gradient waveforms by applying a non-linear scaling function (that is non-linear in the characteristic(s) of the gradient waveforms) to the gradient waveforms. Additional aspects of eddy current correction techniques are described in U.S. Patent Application Publication 2021/0048498 titled "Eddy Current Mitigation Systems and Methods," filed on Aug. 14, 2020, which is incorporated herein by reference in its entirety.

Additionally, in some embodiments, the Gradient (X) signal line 228 and the Gradient (Y) signal line 230 may be configured to provide suitable spatial encoding of the received MR signals during the pulse repetition period 220. In some embodiments, the Gradient (X) signal line 228 and the Gradient (Y) signal line 230 may be configured to provide spatial encoding according to a non-Cartesian sampling pattern (e.g., radial, spiral, rosette, variable density, Lissajou, and/or the example non-Cartesian sampling pattern shown in FIG. 5). In some embodiments, the Gradient (X) signal line 228 and the Gradient (Y) signal line 230 may be configured to provide spatial encoding according to a Cartesian sampling pattern.

Figure 3:
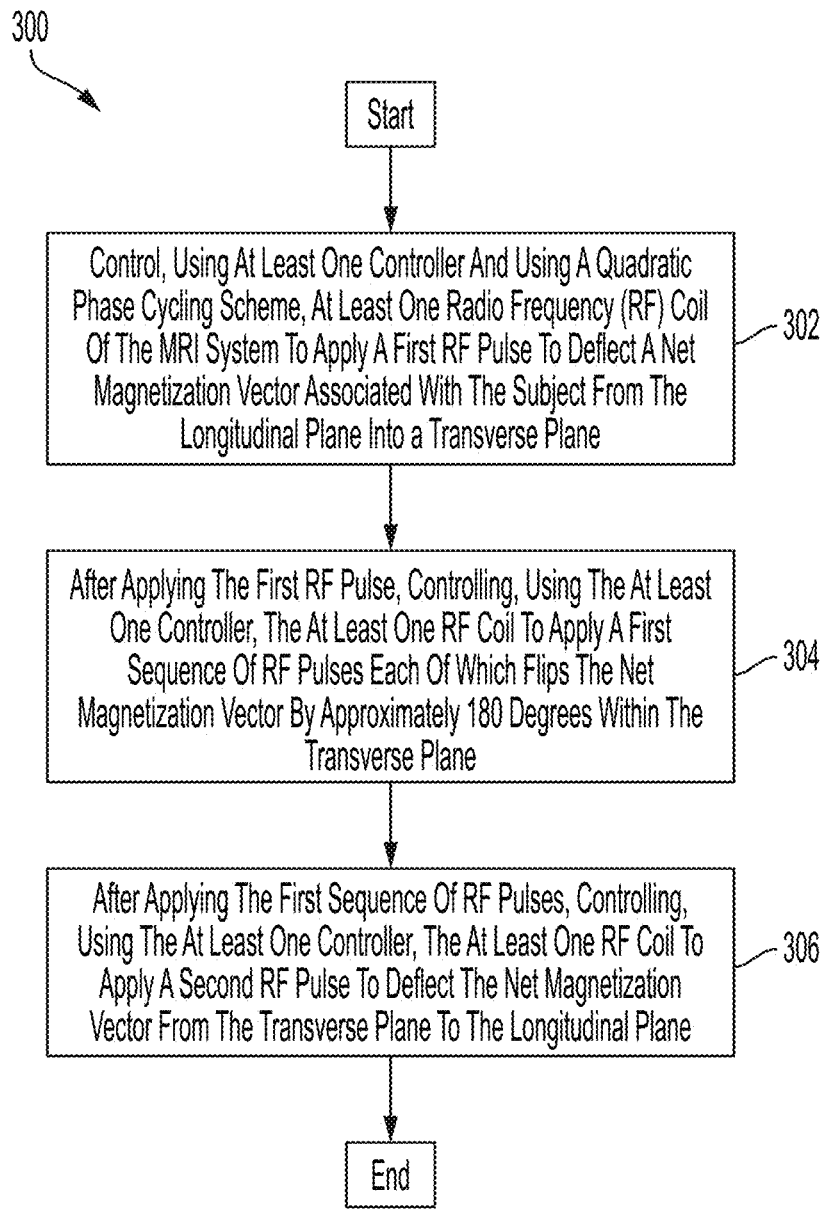
FIG. 3 is flowchart of an illustrative process 300 for performing MRI using a low-field MRI system using a pulse sequence implemented using driven equilibrium and quadratic phase cycling techniques, in accordance with some embodiments of the technology described herein.

FIG. 3 is flowchart of an illustrative process 300 for performing MRI using a low-field MRI system using a pulse sequence implemented using driven equilibrium and quadratic phase cycling techniques, in accordance with some embodiments of the technology described herein. Process 300 may be performed by any suitable low-field MRI system and, for example, may be performed by using low-field MRI system 100 described in connection with FIG. 1.

Process 300 begins at act 302, where at least one controller of an MRI system, using a quadratic phase cycling scheme, controls at least one RF coil to apply a first RF pulse. The first RF pulse may be configured to deflect a net magnetization vector associated with the subject being imaged from a longitudinal plane into a transverse plane. For example, the first RF pulse may be a 90° RF pulse. In some embodiments, the first RF pulse may be an approximately 90° RF pulse. The phase of the first RF pulse may be modulated according to the quadratic phase cycling scheme, as described in connection with FIG. 2A.

Next, process 300 proceeds to act 304, where, after applying the first RF pulse, the controller controls the at least one RF coil to apply a first sequence of RF pulses. Each RF pulse of the first sequence of RF pulses may flip the net magnetization vector associated with the subject by approximately 180 degrees within the transverse plane. For example, each RF pulse may be a 180° RF pulse. In some embodiments, each RF pulse may be an approximately 180° RF pulse. The phase of each RF pulse of the first sequence of RF pulses may also be modulated according to the quadratic phase cycling scheme, as described in connection with FIG. 2A.

In some embodiments, between RF pulses of the first sequence of RF pulses, the MRI system may be configured to receive MR signals from spins associated with the subject being imaged. For example, an ADC coupled to the RF coil may be enabled during the periods of times between RF pulses of the first sequence of RF pulses. The ADC may be configured to convert analog signals produced by the RF coil in response to received MR signals into digital signals for further processing. Additionally, the gradient coils of the MRI system may be configured to apply one or more gradient fields between RF pulses of the first sequence of RF pulses to enable spatial encoding and/or MR signal readout.

Next, process 300 proceeds to act 306, where, after applying the first sequence of RF pulses, the controller controls the at least one RF coil to apply a second RF pulse. The second RF pulse may deflect the net magnetization vector associated with the subject from the transverse plane to the longitudinal plane, performing driven equilibrium and reducing the T1 relaxation time of spins associated with the subject within the imaging region. For example, the second RF pulse may be a 90° RF pulse. In some embodiments, the second RF pulse may be an approximately 90° RF pulse. The phase of the second RF pulse may be modulated according to the quadratic phase cycling scheme, as described in connection with FIG. 2A. For example, the phase of the second RF pulse may be offset from the phase of the ADC pulse.

Figure 4:
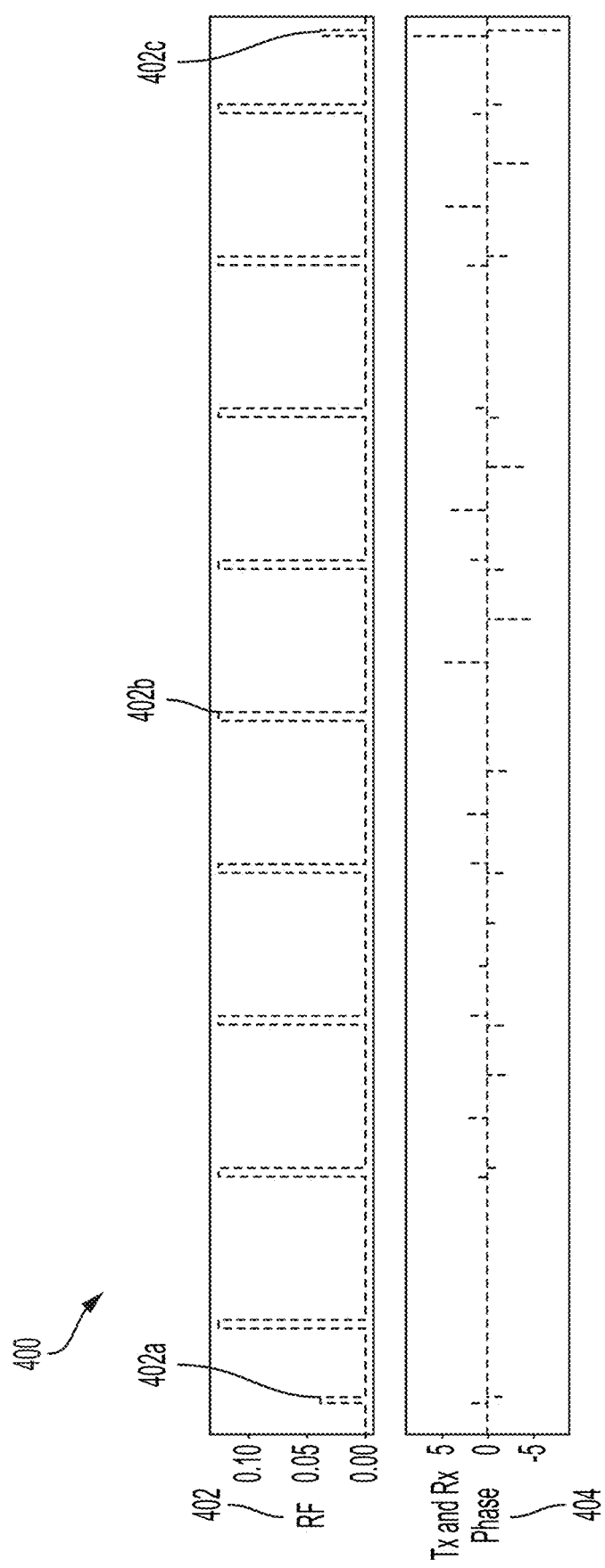
FIG. 4 is a diagram illustrating a T2-weighting preparation pulse sequence, in accordance with some embodiments of the technology described herein.

FIG. 4 is a diagram illustrating a T2-weighting preparation pulse sequence 400, in accordance with some embodiments of the technology described herein. In some embodiments, pulse sequence 400 may be inserted before any readout pulse sequence to add T2 weighting to the pulse sequence. The pulse sequence 400 includes a series of RF pulses 402 that are phase-modulated, as shown by Tx and Rx phase 404, according to a quadratic phase cycling scheme as described in connection with FIG. 2A. The series of RF pulses 402 includes a first RF pulse 402a configured to tip the net magnetization vector associated with the subject from the longitudinal plane into the transverse plane. The first RF pulse 402a may be followed by a series of RF pulses 402b, each configured to apply a 180° RF pulse to flip the net magnetization vector associated with the subject within the transverse plane, bringing the spins of the subject back into phase with each other. The series of RF pulses 402b may be followed by a second RF pulse 402c configured to tip the net magnetization vector associated with the subject from the transverse plane to the longitudinal plane (e.g., to realign the net magnetization vector with the $B_0$ magnetic field). By realigning the net magnetization vector within the longitudinal plane, the T1 relaxation time of the spins within the subject may be reduced, thereby removing T1 effects (and including T2-weighting) from a subsequent MR image acquisition sequence.

Figure 5:
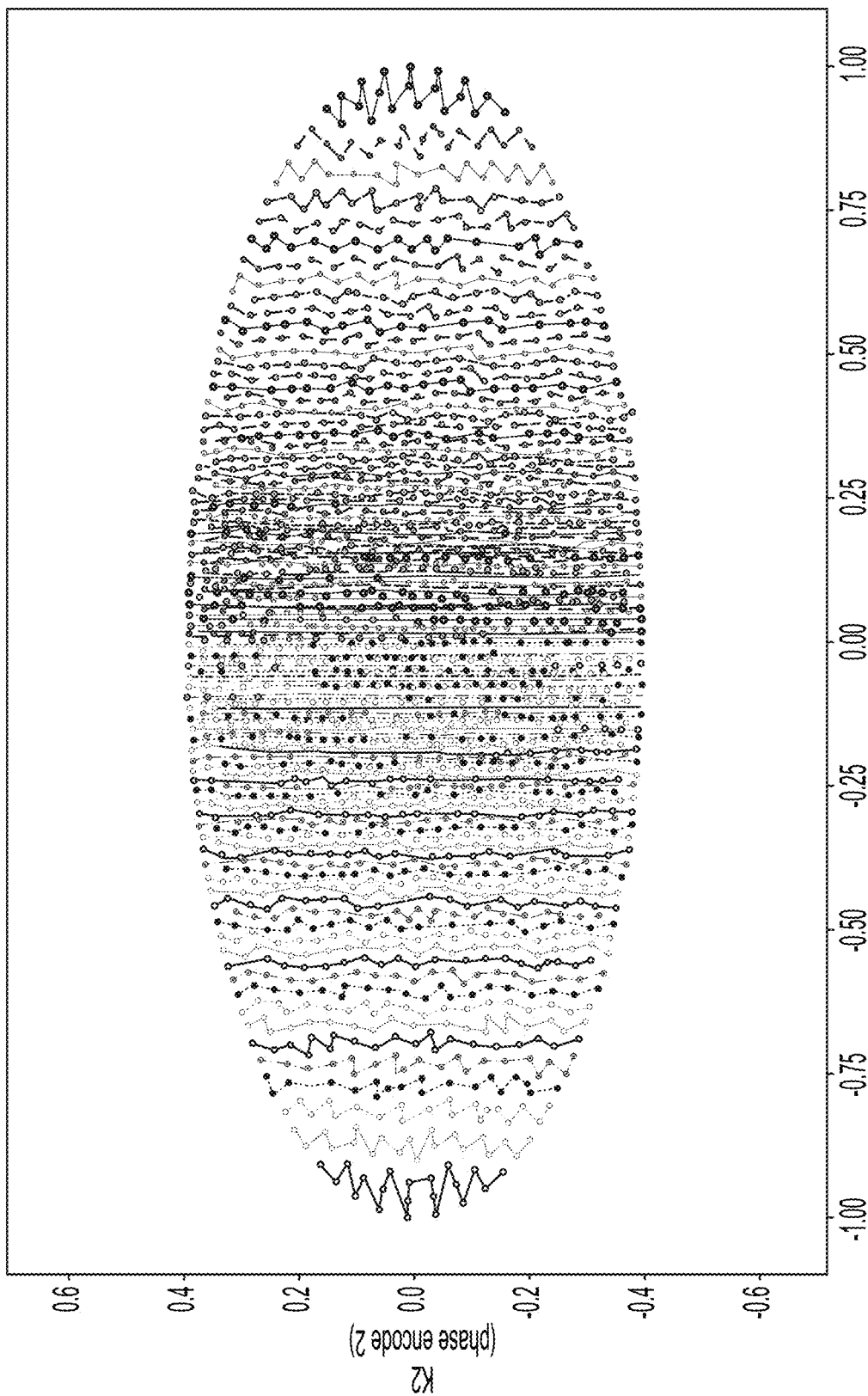
FIG. 5 shows an illustrative non-Cartesian sampling pattern for the sampling of k-space by a pulse sequence, in accordance with some embodiments of the technology described herein.

FIG. 5 shows an illustrative non-Cartesian sampling pattern for the sampling of k-space by using a pulse sequence, in accordance with some embodiments of the technology described herein. The illustrative non-Cartesian sampling pattern may connect sampling points within a disk using a linear or pseudo-linear sampling path within the disk and may be implemented in connection with any of the pulse sequences described herein (e.g., FSE, T2-weighted, FLAIR, and/or any combination of said pulse sequences).

Figure 6A:
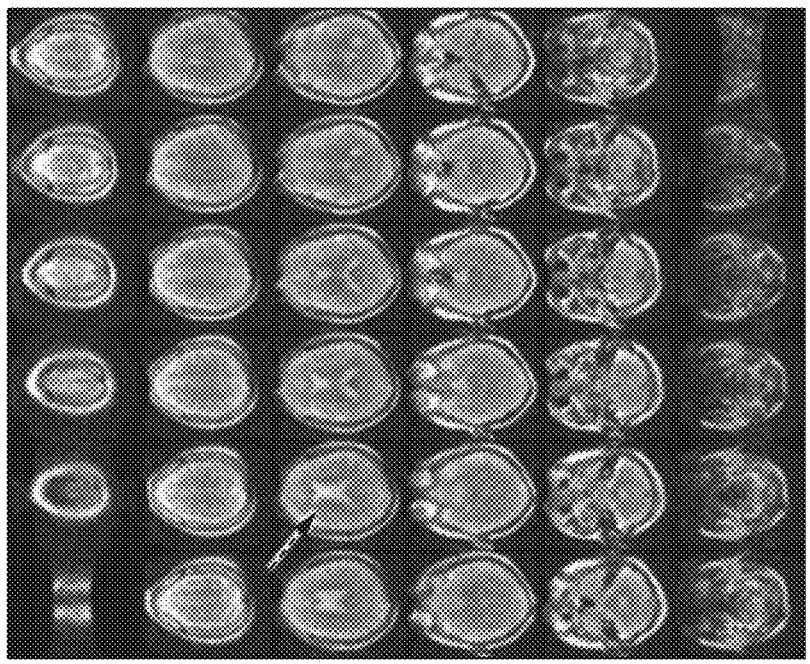
FIG. 6A shows illustrative magnetic resonance (MR) images of a subject's brain acquired using a fast spin echo T2-weighted sequence implemented without using driven equilibrium and quadratic phase cycling techniques.
Figure 6B:
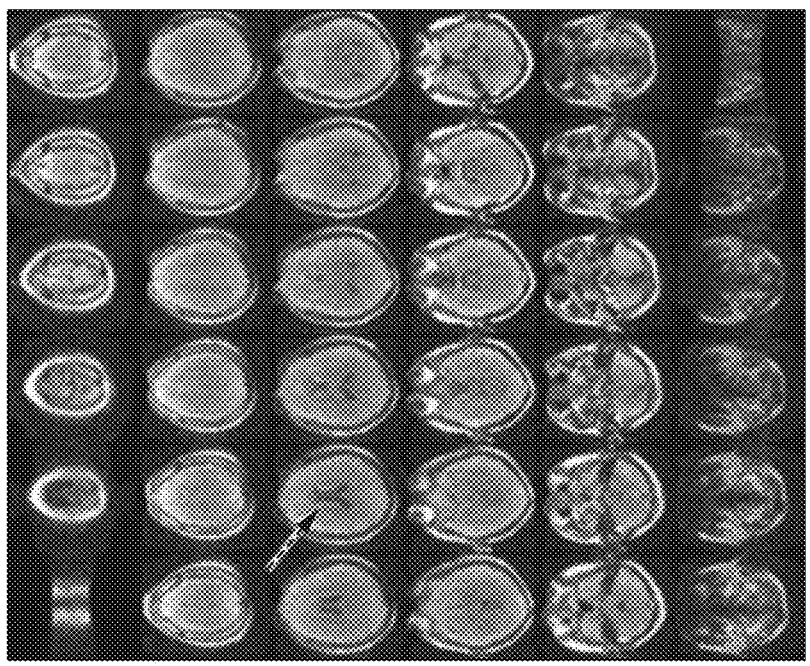
FIG. 6B shows illustrative MR images of a subject's brain acquired using a fast spin echo T2-weighted sequence implemented using the driven equilibrium and quadratic phase cycling techniques, in accordance with some embodiments of the technology described herein.

FIG. 6A shows illustrative MR images of a subject's brain acquired using a fast spin echo T2-weighted pulse sequence implemented without using driven equilibrium and quadratic phase cycling techniques. FIG. 6B shows illustrative MR images of the same subject's brain acquired using a fast spin echo T2-weighted pulse sequence implemented using driven equilibrium and quadratic phase cycling techniques, in accordance with some embodiments of the technology described herein. Both sets of MR images were acquired with pulse sequences implementing 1.5 seconds between each series of 180 degree RF pulses. The MR images of FIG. 6A show dark regions of CSF in the center of the subject's brain, where CSF should be shown as bright in T2-weighted MR images because the spins of the CSF were not able to realign with the $B_0$ magnetic field before the next pulse repetition period began. FIG. 6B, in contrast, shows the CSF as bright regions, indicating that the driven equilibrium and quadratic phase cycling techniques recovered the magnetization of the spins in the regions of CSF within a shortened TR. The total time to acquire the series of MR images of FIG. 6B was 3 minutes.

Figure 7:
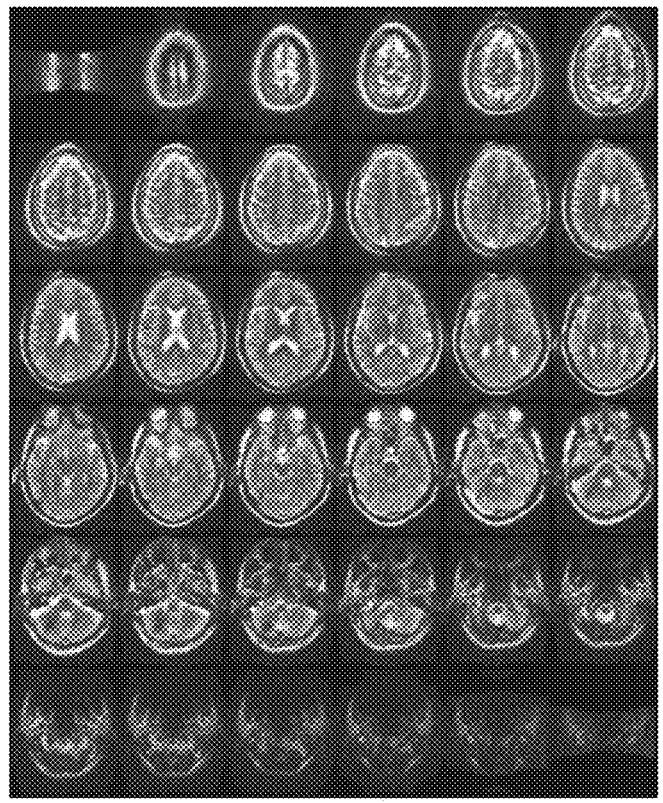
FIG. 7 shows illustrative MR images of a subject's brain acquired using a fast spin echo T2-weighted sequence implemented using driven equilibrium and quadratic phase cycling techniques, in accordance with some embodiments of the technology described herein.

FIG. 7 shows illustrative MR images of a subject's brain acquired using a fast spin echo T2-weighted pulse sequence implemented using driven equilibrium and quadratic phase cycling techniques, in accordance with some embodiments of the technology described herein. The pulse repetition periods of the pulse sequence used to acquire the MR images of FIG. 7 had a TR of one second, and the total time to acquire the MR data was 2:20 minutes.

Figure 8:
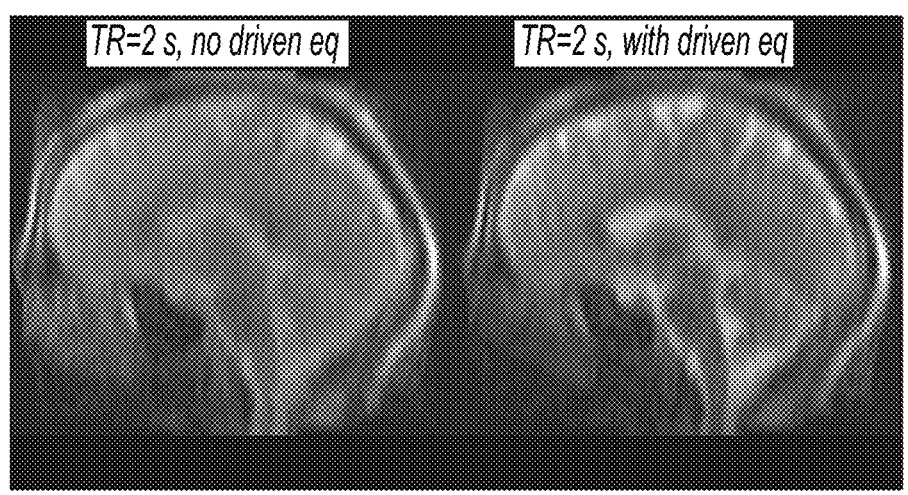
FIG. 8 shows illustrative MR images of a subject's brain acquired using a fast spin echo T2-weighted sequence implemented without using driven equilibrium and quadratic phase cycling techniques (left) and with using driven equilibrium and quadratic phase cycling techniques (right) for a same repetition time (TR), in accordance with some embodiments of the technology described herein.

FIG. 8 shows illustrative MR images of a subject's brain acquired using a fast spin echo T2-weighted sequence implemented without using driven equilibrium and quadratic phase cycling techniques (left) and with using driven equilibrium and quadratic phase cycling techniques (right) for a same repetition time (TR), in accordance with some embodiments of the technology described herein. The MR images are shown in the sagittal plane of the subject, and each MR image was acquired using a pulse sequence having a TR of 2 seconds. The image on the right, acquired using driven equilibrium and quadratic phase cycling techniques, shows additional contrast as compared to the image on the left, acquired without using driven equilibrium and quadratic phase cycling techniques, particularly for regions including volumes of CSF.

Figure 9:
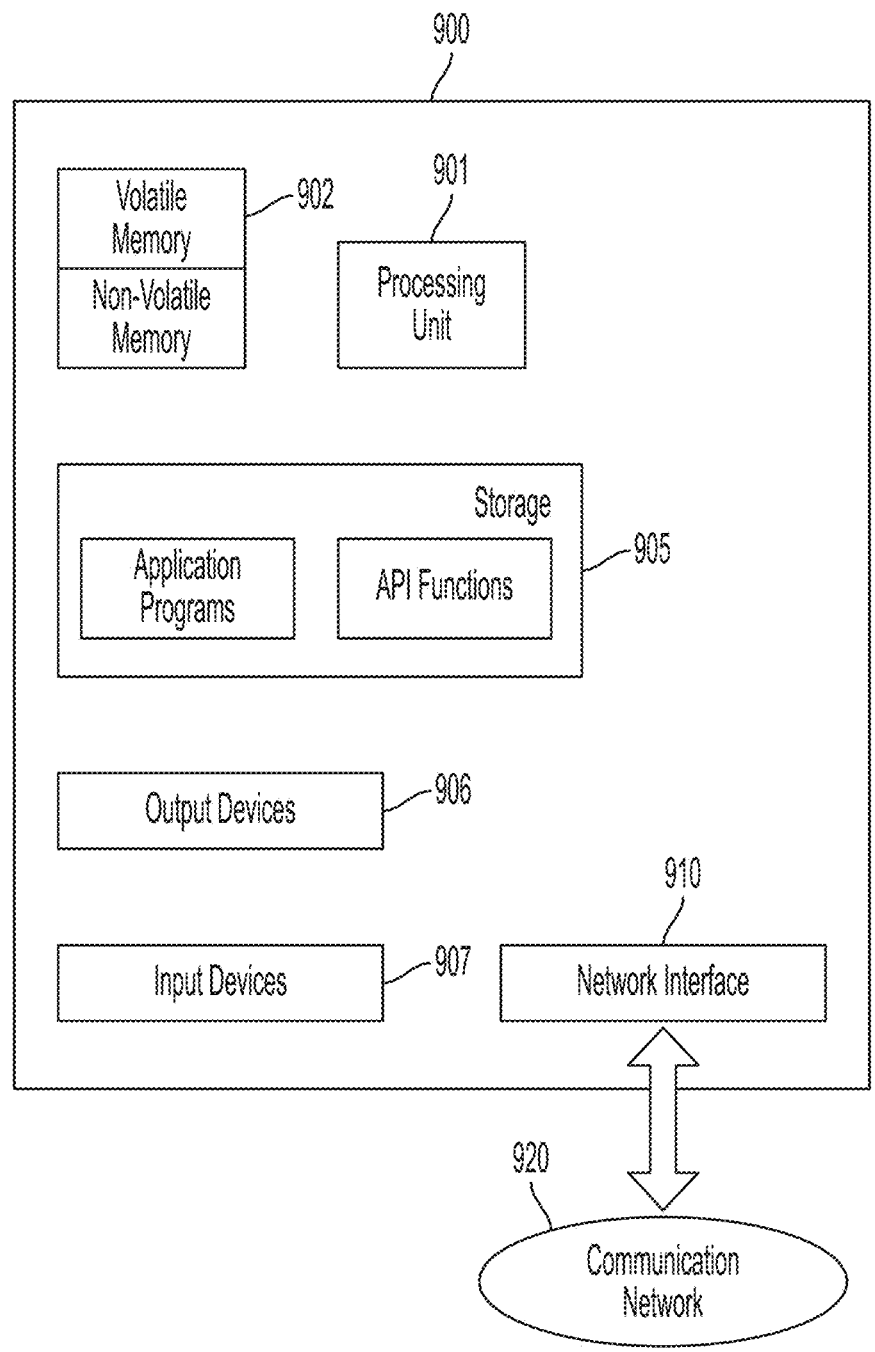
FIG. 9 depicts, schematically, an illustrative computing device on which aspects of the technology described herein may be implemented.

FIG. 9 shows, schematically, an illustrative computer 900 on which any aspect of the present disclosure may be implemented.

In the embodiment shown in FIG. 9, the computer 900 includes a processing unit 901 having one or more processors and a non-transitory computer-readable storage medium 902 that may include, for example, volatile and/or non-volatile memory. The memory 902 may store one or more instructions to program the processing unit 901 to perform any of the functions described herein. The computer 900 may also include other types of non-transitory computer-readable medium, such as storage 905 (e.g., one or more disk drives) in addition to the system memory 902. The storage 905 may also store one or more application programs and/or resources used by application programs (e.g., software libraries), which may be loaded into the memory 902.

The computer 900 may have one or more input devices and/or output devices, such as devices 906 and 907 illustrated in FIG. 9. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards and pointing devices, such as mice, touch pads, and digitizing tablets. As another example, the input devices 907 may include a microphone for capturing audio signals, and the output devices 906 may include a display screen for visually rendering, and/or a speaker for audibly rendering, recognized text. As another example, the input devices 907 may include sensors (e.g., electrodes in a pacemaker), and the output devices 906 may include a device configured to interpret and/or render signals collected by the sensors (e.g., a device configured to generate an electrocardiogram based on signals collected by the electrodes in the pacemaker).

As shown in FIG. 9, the computer 900 may also comprise one or more network interfaces (e.g., the network interface 910) to enable communication via various networks (e.g., the network 920). Examples of networks include a local area network or a wide area network, such as an enterprise network or the Internet. Such networks may be based on any suitable technology and may operate according to any suitable protocol and may include wireless networks, wired networks or fiber optic networks. Such networks may include analog and/or digital networks.

Having thus described several aspects of at least one embodiment of this technology, it is to be appreciated that various alterations, modifications, and improvements will readily occur to those skilled in the art.

The above-described embodiments of the technology described herein can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, or semi-custom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. Though, a processor may be implemented using circuitry in any suitable format.

Also, the various methods or processes outlined herein may be coded as software that is executable on one or more processors running any one of a variety of operating systems or platforms. Such software may be written using any of a number of suitable programming languages and/or programming tools, including scripting languages and/or scripting tools. In some instances, such software may be compiled as executable machine language code or intermediate code that is executed on a framework or virtual machine. Additionally, or alternatively, such software may be interpreted.

The techniques disclosed herein may be embodied as a non-transitory computer-readable medium (or multiple computer-readable media) (e.g., a computer memory, one or more floppy discs, compact discs, optical discs, magnetic tapes, flash memories, circuit configurations in Field Programmable Gate Arrays or other semiconductor devices, or other non-transitory, tangible computer storage medium) encoded with one or more programs that, when executed on one or more processors, perform methods that implement the various embodiments of the present disclosure described above. The computer-readable medium or media may be transportable, such that the program or programs stored thereon may be loaded onto one or more different computers or other processors to implement various aspects of the present disclosure as described above.

The terms "program" or "software" are used herein to refer to any type of computer code or set of computer-executable instructions that may be employed to program one or more processors to implement various aspects of the present disclosure as described above. Moreover, it should be appreciated that according to one aspect of this embodiment, one or more computer programs that, when executed, perform methods of the present disclosure need not reside on a single computer or processor, but may be distributed in a modular fashion amongst a number of different computers or processors to implement various aspects of the present disclosure.

Various aspects of the technology described herein may be used alone, in combination, or in a variety of arrangements not specifically described in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the technology described herein may be embodied as a method, examples of which are provided herein including with reference to FIG. 3. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The terms "approximately" and "about" may be used to mean within ±20% of a target value in some embodiments, within ±10% of a target value in some embodiments, within ±5% of a target value in some embodiments, within ±2% of a target value in some embodiments, within ±1% in some embodiments. The terms "approximately" and "about" may include the target value.

The invention claimed is:

1. A magnetic resonance imaging (MRI) system, comprising:
   at least one radio frequency (RF) coil for transmitting and/or receiving RF pulses;
   a direct digital synthesizer (DDS) coupled to the at least one RF coil; and
   at least one controller configured to operate the at least one RF coil in accordance with a pulse sequence having a plurality of pulse repetition periods;
   wherein, during one pulse repetition period of the plurality of pulse repetition periods, the at least one controller is configured to modify a waveform generated by the DDS and to control the at least one RF coil to generate an RF pulse to deflect a net magnetization vector associated with a subject being imaged by the MRI system from a transverse plane to a longitudinal plane.

2. The MRI system of claim 1, wherein the controller is configured to use a phase cycling scheme to modify the waveform.

3. The MRI system of claim 1, further comprising an analog-to-digital converter (ADC) coupled to the at least one RF coil, wherein controlling the at least one RF coil further comprises setting a phase of at least one RF pulse generated during the one pulse repetition period based on a phase of the ADC.

4. The MRI system of claim 1, wherein controlling the at least one RF coil further comprises controlling, using the at least one controller, the at least one RF coil to:
   apply a first RF pulse to deflect the net magnetization vector from a longitudinal plane into a transverse plane; and
   apply second RF pulses, each of which flips the net magnetization vector by approximately 180 degrees within the transverse plane.

5. The MRI system of claim 4, further comprising an ADC coupled to the at least one RF coil, wherein the at least one controller is further configured to control the ADC to periodically enable the ADC in conjunction with the second RF pulses, wherein a center of each period of ADC enablement corresponds to a center of each period of time between RF pulses of the second RF pulses.

6. The MRI system of claim 1, wherein the MRI system further comprises a $B_0$ magnetic component configured to produce a $B_0$ magnetic field for the MRI system, wherein the $B_0$ magnetic component comprises at least one permanent magnet.

7. The MRI system of claim 6, wherein the $B_0$ magnetic component is configured to produce a $B_0$ field having a strength greater than or equal to 0.02T and less than or equal to 0.2T.

8. The MRI system of claim 6, wherein the $B_0$ magnetic component is configured to produce a $B_0$ field having a strength greater than or equal to 0.05T and less than or equal to 0.1 T.

9. The MRI system of claim 1, wherein the at least one controller is further configured to, before the one pulse repetition period, control the at least one RF coil to apply a plurality of RF pulses to the subject, the plurality of RF pulses configured to perform T2-weighting preparation.

10. A method of acquiring a magnetic resonance (MR) image of a subject using a magnetic resonance imaging (MRI) system, the method comprising:

during one pulse repetition period of a plurality of pulse repetition periods of a pulse sequence, the plurality of pulse repetition periods being periods over which MR signals are produced and detected:
controlling at least one radio frequency (RF) coil of the MRI system, using at least one controller configured to modify a waveform generated by a direct digital synthesizer (DDS) coupled to the at least one RF coil, the controlling comprising generating an RF pulse to deflect a net magnetization vector associated with the subject from a transverse plane to a longitudinal plane.

11. The method of claim 10, wherein the at least one controller is configured to use a phase cycling scheme to modify the waveform.

12. The method of claim 11, wherein controlling the at least one RF coil using the phase cycling scheme comprises setting a phase of the RF pulse generated during the one pulse repetition period based on a phase of an analog-to-digital converter (ADC) coupled to the at least one RF coil.

13. The method of claim 10, further comprising controlling the at least one RF coil to generate a plurality of RF pulses in accordance with a fast spin echo pulse sequence, a T2-weighted pulse sequence, and/or a fluid-attenuated inversion recovery (FLAIR) pulse sequence.

14. The method of claim 10, further comprising controlling the at least one RF coil to generate a plurality of first RF pulses by:
controlling, using the at least one controller, the at least one RF coil to apply a first RF pulse of the plurality of first RF pulses to deflect the net magnetization vector from a longitudinal plane into a transverse plane; and
controlling, using the at least one controller, the at least one RF coil to apply second RF pulses of the plurality of first RF pulses, each of which flips the net magnetization vector by approximately 180 degrees within the transverse plane.

15. The method of claim 14, further comprising, while controlling the at least one RF coil to apply the second RF pulses of the plurality of first RF pulses, setting a phase of at least some RF pulses of the second RF pulses of the plurality of first RF pulses in accordance with a phase cycling scheme.

16. The method of claim 14, further comprising periodically enabling, using the at least one controller, an analog-to-digital converter (ADC) coupled to the at least one RF coil in conjunction with pulses of the second RF pulses of the plurality of first RF pulses, wherein a center of each period of ADC enablement corresponds to a center of each period of time between RF pulses of the second RF pulses of the plurality of first RF pulses.

17. The method of claim 10, further comprising operating, using the at least one controller and before applying the RF pulse, at least one gradient coil of the MRI system to generate one or more preparation gradient field pulses.

18. At least one non-transitory computer-readable storage medium storing processor-executable instructions that, when executed by a magnetic resonance imaging (MRI) system, cause the MRI system to perform a method comprising:
during one pulse repetition period of a plurality of pulse repetition periods of a pulse sequence, the plurality of pulse repetition periods being periods over which MR signals are produced and detected:
controlling at least one radio frequency (RF) coil of the MRI system, using at least one controller configured to modify a waveform generated by a direct digital synthesizer (DDS) coupled to the at least one RF coil, the controlling comprising controlling the at least one RF coil to generate an RF pulse to deflect a net magnetization vector associated with a subject being imaged by the MRI system from a transverse plane to a longitudinal plane.

19. The at least one non-transitory computer-readable storage medium of claim 18, wherein a phase cycling scheme is used to modify the waveform.

20. The at least one non-transitory computer-readable storage medium of claim 18, wherein using the phase cycling scheme comprises setting a phase of at least one RF pulse generated during the one pulse repetition period based on a phase of an analog-to-digital converter (ADC) coupled to the at least one RF coil.

* * * * *